United States Patent
Nanataki et al.

(10) Patent No.: US 7,414,352 B2
(45) Date of Patent: Aug. 19, 2008

(54) PIEZOELECTRIC/ELECTROSTRICTIVE BODY, PIEZOELECTRIC/ELECTROSTRICTIVE LAMINATE, AND PIEZOELECTRIC/ELECTROSTRICTIVE ACTUATOR

(75) Inventors: Tsutomu Nanataki, Toyoake (JP); Mutsumi Kitagawa, Inuyama (JP); Toshikatsu Kashiwaya, Inazawa (JP)

(73) Assignee: NGK Insulators, Ltd., Nagoya (JP)

( * ) Notice: Subject to any disclaimer, the term of this patent is extended or adjusted under 35 U.S.C. 154(b) by 84 days.

(21) Appl. No.: 11/305,660

(22) Filed: Dec. 16, 2005

(65) Prior Publication Data

US 2006/0138899 A1 Jun. 29, 2006

(30) Foreign Application Priority Data

Dec. 24, 2004 (JP) ............................. 2004-374499

(51) Int. Cl.
*H01L 41/187* (2006.01)
(52) U.S. Cl. ..................................... 310/358
(58) Field of Classification Search ................ 310/358; 252/62.9 R, 62.9 PZ
See application file for complete search history.

(56) References Cited

U.S. PATENT DOCUMENTS

| | | | |
|---|---|---|---|
| 3,425,944 A * | 2/1969 | Nishida et al. | 252/62.9 PZ |
| 6,093,338 A | 7/2000 | Tani et al. | |
| 6,523,943 B1 | 2/2003 | Fukui | |
| 2004/0051422 A1 * | 3/2004 | Kashiwaya et al. | 310/324 |

FOREIGN PATENT DOCUMENTS

| | | | |
|---|---|---|---|
| EP | 0821415 | * | 1/1998 |
| EP | 1 376 711 A2 | | 1/2004 |
| EP | 1 480 279 A2 | | 11/2004 |
| JP | 44-17103 | | 7/1969 |
| JP | 45-8145 | | 3/1970 |

OTHER PUBLICATIONS

Horn J.A. et al: "Fabrication of Textured $Bi_4Ti_3O_{12}$ by Templated Grain Growth", Proceedings of the Tenth IEEE International Symposium on Applications of Ferroelectrics (ISAF '96), East Brunswick, NJ, USA Aug. 18-21, 1996, New York, USA, vol. 2, Aug. 18, 1996, pp. 943-946.

Sabolsky E.M. et al.: "Dielectric and piezoelectric properties of <001> fiber-textured 0.675 $Pb(Mg_{1/3}Nb_{2/3})O_3$-0.325$PbTiO_3$ ceramics", Journal of Applied Physics, American Institute of Physics, New York, US, vol. 93, No. 7, Apr. 1, 2003, pp. 4072-4080.

(Continued)

*Primary Examiner*—Darren Schuberg
*Assistant Examiner*—Derek J Rosenau
(74) *Attorney, Agent, or Firm*—Burr & Brown (57) ABSTRACT

There is disclosed a piezoelectric/electrostrictive body which has superior piezoelectric/electrostrictive properties and which exhibits a sufficient durability even in a case where a flexural displacement is repeated a large number of times. A piezoelectric/electrostrictive body is constituted of a large number of crystal grains having the piezoelectric/electrostrictive properties in the form of a film or a layer having one or more layers. A number ratio of crystal grains whose grain diameters W in a width direction are longer than grain diameters T in a thickness direction is 70% or more of a large number of crystal grains observed in an arbitrary section in the thickness direction.

10 Claims, 7 Drawing Sheets

OTHER PUBLICATIONS

R.C. Buchanan et al., "Orientation effects on polarization and pyroelectric properties of ferroelectric thin films on Si", J. Euro. Ceramic Soc. 21 (2001) 1577-1580.

S. Okamura et al., "Improvement in Fatigue Properties of Ferroelectric $Bi_4Ti_3O_{12}$ Thin Films by Heat Treatment in $O_2$ Gas at High Pressure", Proceedings of ISAF '96, vol. 1, pp. 463-466.

* cited by examiner

PIEZOELECTRIC/ELECTROSTRICTIVE BODY, PIEZOELECTRIC/ELECTROSTRICTIVE LAMINATE, AND PIEZOELECTRIC/ELECTROSTRICTIVE ACTUATOR

BACKGROUND OF THE INVENTION

1. Field of the Invention

The present invention relates to a piezoelectric/electrostrictive body, a piezoelectric/electrostrictive laminate, and a piezoelectric/electrostrictive film type actuator.

2. Description of the Related Art

Heretofore, a piezoelectric/electrostrictive actuator has been known as an actuator capable of controlling a micro displacement of the order of sub-microns. Especially, in a piezoelectric/electrostrictive film type actuator, a piezoelectric/electrostrictive portion constituted of a piezoelectric/electrostrictive porcelain composition, and a piezoelectric/electrostrictive driving portion having an electrode portion to which a voltage is applied are disposed on a substrate made of a ceramic. This actuator is suitable for the control of the micro displacement, and additionally has superior properties such as a high electromechanical conversion efficiency, a high-speed response, a high durability, and a saved power consumption. These piezoelectric/electrostrictive actuators are used in various applications such as a piezoelectric pressure sensor, a probe moving mechanism of a scanning type tunnel microscope, a rectilinear guide mechanism in an ultra-precision working device, a servo valve for a hydraulic control, a head of a VTR device, a pixel constituting a flat panel type image display device, and a head of an ink jet printer.

Moreover, various investigations are also made with respect to the piezoelectric/electrostrictive porcelain composition constituting the piezoelectric/electrostrictive portion. For example, there is disclosed a $Pb(Mg_{1/3}Nb_{2/3})O_3$—$PbTiO_3$—$PbZrO_3$ ternary solid solution system composition or a piezoelectric/electrostrictive porcelain composition in which a part of Pb of the composition is replaced with Sr, La or the like (see, e.g., JP-B-44-17103 and JP-B-45-8145). It is expected that a piezoelectric/electrostrictive element having superior piezoelectric/electrostrictive properties (e.g., a piezoelectric d constant) is obtained with respect to a piezoelectric/electrostrictive portion itself that is the most important portion for determining the piezoelectric/electrostrictive properties of the piezoelectric/electrostrictive element.

In recent years, with a rapid industrial development, there is required to be developed a piezoelectric/electrostrictive body or a piezoelectric/electrostrictive film type actuator having more superior piezoelectric/electrostrictive properties that a sufficiently large displacement can be obtained even in a low electric field. However, it cannot be said that a conventional piezoelectric/electrostrictive body or the like sufficiently satisfies such requirement, and there is room for further improvement.

Moreover, in a case where a flexural displacement is repeated a large number of times, there are problems that structural disadvantages such as micro cracks are easily generated in the piezoelectric/electrostrictive portion, a durability rapidly drops, and initial piezoelectric/electrostrictive properties are not exhibited. Therefore, there is a demand for development of a piezoelectric/electrostrictive body or a piezoelectric/electrostrictive film type actuator which exhibits a sufficient durability even in a case where the flexural displacement is repeated a large number of times.

SUMMARY OF THE INVENTION

The present invention has been developed in view of such problem of the conventional technology, and an object thereof is to provide a piezoelectric/electrostrictive body, a piezoelectric/electrostrictive laminate, and a piezoelectric/electrostrictive film type actuator which have superior piezoelectric/electrostrictive properties and which exhibit a sufficient durability even in a case where a flexural displacement is repeated a large number of times.

As a result of intensive investigation to achieve the above-described object, the present inventors have found that the above-described object can be achieved by setting a number ratio of flat crystal grains whose grain diameters in a width direction are longer than those in a thickness direction to be not less than a predetermined ratio with respect to a large number of crystal grains observed in an arbitrary section in the thickness direction, and they have completed the present invention.

That is, according to the present invention, there are provided a piezoelectric/electrostrictive body, a piezoelectric/electrostrictive laminate, and a piezoelectric/electrostrictive film type actuator which will be described.

[1] A piezoelectric/electrostrictive body constituted of a large number of crystal grains having piezoelectric/electrostrictive properties in the form of a film or a layer having one or more layers, wherein a number ratio of crystal grains whose grain diameters in a width direction are longer than those in a thickness direction is 70% or more of the large number of crystal grains observed in an arbitrary section in the thickness direction.

[2] The piezoelectric/electrostrictive body according to [1], wherein an average value of ratios (W/T) of the grain diameters (W) in the width direction to the grain diameters (T) in the thickness direction is 1.3 or more in the large number of crystal grains observed in the arbitrary section in the thickness direction.

[3] The piezoelectric/electrostrictive body according to [1] or [2], whose thickness is in a range of 1 to 20 µm.

The piezoelectric/electrostrictive body according to any one of [1] to [3], wherein an average value of the numbers of the crystal grains in the thickness direction, observed in the arbitrary section in the thickness direction, is 2 or less.

[5] A piezoelectric/electrostrictive laminate comprising a plurality of piezoelectric/electrostrictive bodies according to any one of [1] to [4]; and a plurality of film-like or layer-like electrodes, wherein the plurality of piezoelectric/electrostrictive bodies are alternately sandwiched between and laminated on the plurality of electrodes.

[6] A piezoelectric/electrostrictive film type actuator comprising: a substrate made of a ceramic; and a piezoelectric/electrostrictive driving portion disposed on the substrate and having at least one piezoelectric/electrostrictive portion and at least one pair of electrodes, the substrate being displaced by driving of the piezoelectric/electrostrictive driving portion, wherein the piezoelectric/electrostrictive portion is constituted of the piezoelectric/electrostrictive body according to any one of [1] to [4].

The piezoelectric/electrostrictive body of the present invention has superior piezoelectric/electrostrictive properties, and produces an effect that a sufficient durability is exhibited even in a case where a flexural displacement is repeated a large number of times.

The piezoelectric/electrostrictive laminate of the present invention has superior piezoelectric/electrostrictive properties, and produces the effect that the sufficient durability is exhibited even in the case where the flexural displacement is repeated a large number of times.

The piezoelectric/electrostrictive film type actuator of the present invention has superior piezoelectric/electrostrictive properties, and produces the effect that the sufficient durability is exhibited even in the case where the flexural displacement is repeated a large number of times.

BRIEF DESCRIPTION OF THE DRAWINGS

FIG. 7($a$) is a top plan view schematically showing a further embodiment of the piezoelectric/electrostrictive film type actuator of the present invention;

FIG. 7($b$) is a sectional view schematically showing a still further embodiment of the piezoelectric/electrostrictive film type actuator of the present invention;

FIG. 14($a$) is an X-X' sectional view of the embodiment shown in FIG. 8; and

FIG. 14($b$) is a top plan view of the embodiment shown in FIG. 8.

The following is given to explain what member and/or portion stand for by the referential numerals used in the respective figures.

1 . . . substrate, 1$a$ . . . bonding surface, 1$b$ . . . thick portion, 1$c$ . . . thin portion, 2, 2$a$, 2$b$, 2$c$, 3, 3$a$, 3$b$, 3$c$ . . . piezoelectric/electrostrictive portion, 4, 5, 6, 14, 16 . . . electrode, 10, 10$a$, 10$b$, 10$c$ . . . piezoelectric/electrostrictive driving portion unit, 12 . . . first piezoelectric/electrostrictive portion, 13 . . . second piezoelectric/electrostrictive portion, 15 . . . lowermost piezoelectric/electrostrictive portion, 20 . . . common substrate, 30 . . . piezoelectric/electrostrictive body, 31 . . . crystal grains, 32 . . . flat crystal grain, 33 . . . specific crystal grain, 35 . . . straight line, 37 . . . grain boundary layer, 51 . . . piezoelectric/electrostrictive film type actuator, P . . . width of lower electrode, Q . . . width of intermediate electrode, R . . . width of upper electrode, T . . . grain diameter in thickness direction, and W . . . grain diameter in width direction.

DESCRIPTION OF THE PREFERRED EMBODIMENT

The best mode for carrying out the present invention will be described hereinafter, but it should be understood that the present invention is not limited to the following embodiments, and the scope of the present invention includes even the following embodiments subjected to appropriate changes, improvements or the like based on ordinary knowledge of a person skilled in the art without departing from the scope of the present invention.

Figure 1:
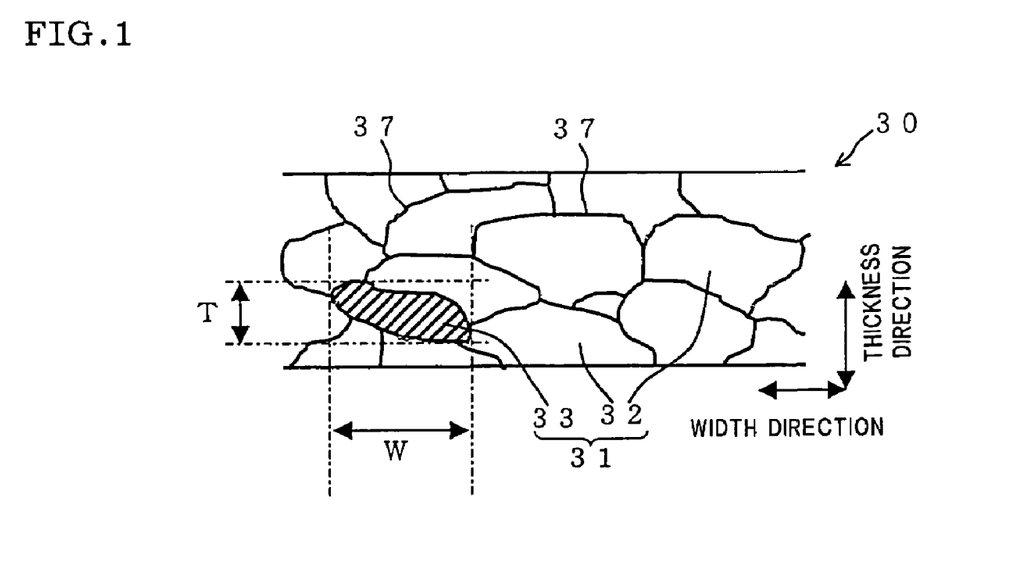
FIG. 1 is a partially sectional view schematically showing one embodiment of a piezoelectric/electrostrictive body of the present invention.

FIG. 1 is a partially sectional view schematically showing one embodiment of a piezoelectric/electrostrictive body of the present invention, and is a drawing showing a section whose arbitrary portion is cut in a thickness direction. According to the present embodiment, as shown in FIG. 1, a piezoelectric/electrostrictive body 30 has a film-like structure or a layered structure which are constituted of a large number of crystal grains 31 having one or more layers of the crystal grains. The large number of crystal grains 31 has piezoelectric/electrostrictive properties, that is, the crystal grains are constituted of a piezoelectric/electrostrictive porcelain composition.

In the piezoelectric/electrostrictive body 30 of the present embodiment, a number ratio (hereinafter referred to simply as the "flat crystal grain ratio") of crystal grains (flat crystal grains 32) whose grain diameters W in a width direction are longer than grain diameters T in a thickness direction is 70% or more of a large number of crystal grains 31 observed in an arbitrary section in the thickness direction. When the flat crystal grain ratio is set to be not less than a predetermined ratio in this manner, the piezoelectric/electrostrictive body is largely displaced even in a case where a comparatively low voltage is applied, and the piezoelectric/electrostrictive body exhibits superior piezoelectric/electrostrictive properties. This is supposedly because the number of crystal grains 31 in a direction (width direction in FIG. 1) vertical to an electric field direction (thickness direction in FIG. 1) is small, and a volume ratio of grain boundary layers 37 which do not contribute to an electric field induced strain at an electric field applied.

Moreover, according to the present embodiment, the piezoelectric/electrostrictive body 30 exhibits a sufficient durability even in a case where a flexural displacement is repeated a large number of times. This is supposedly because the volume ratio of the grain boundary layers 37 having a comparatively low strength against a tensile or compressive stress generated during occurrence of the flexural displacement is small. It is to be noted that from a viewpoint that more superior piezoelectric/electrostrictive properties and durability be exhibited, the flat crystal grain ratio is preferably 78% or more, more preferably 85% or more.

Figure 2:
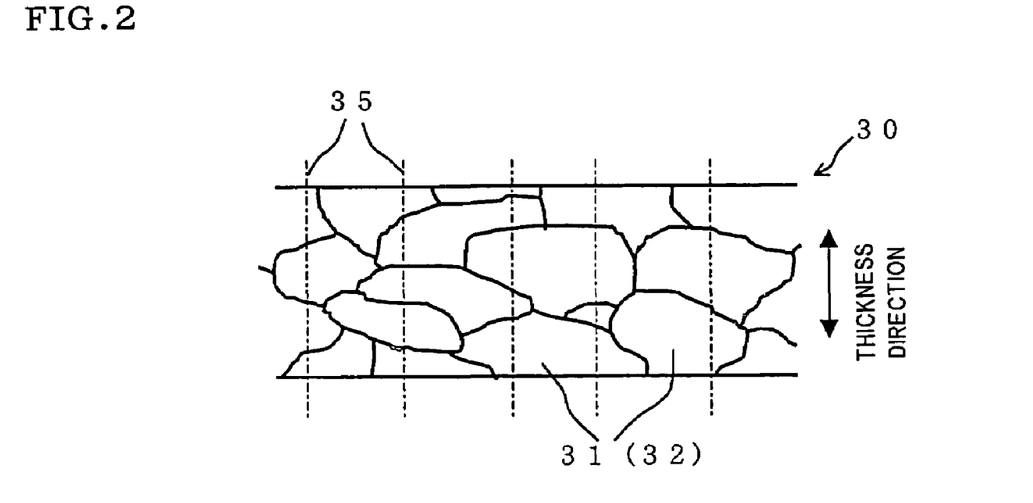
FIG. 2 is a schematic diagram showing a method of calculating an average value of crystal grain numbers in a thickness direction of the piezoelectric/electrostrictive body.

As to the large number of crystal grains observed in the arbitrary section of the thickness direction in the piezoelectric/electrostrictive body 30 of the present embodiment, an average value of ratios (W/T) (hereinafter referred to simply as the "aspect ratios") of grain diameters (W) in the width direction to grain diameters (T) in the thickness direction is preferably 1.3 or more, more preferably 1.5 or more, especially preferably 1.7 or more (see FIG. 2). When the average value of the aspect ratios of the piezoelectric/electrostrictive body 30 is within the numeric value range, more superior piezoelectric/electrostrictive properties are displayed, and a further durability is exhibited.

Here, there will be described a method of measuring the grain diameter T of each crystal grain 31 in the thickness direction and the grain width W thereof in the width direction, and a method of calculating the average value of the aspect ratios of the crystal grains 31 in the present specification with reference to FIG. 1. To facilitate understanding, they will be described in accordance with crystal grains (specific crystal grains 33) shown by slant lines among the large number of crystal grains 31 in an example. The "grain diameter T in the thickness direction" is measured as a length (T) between an uppermost end and a lowermost end in the thickness direction. The "grain diameter W in the width direction" is measured as a length (W) between a leftmost end and a rightmost end in a direction (width direction) crossing the thickness direction at right angles. On the other hand, to obtain the "average value of the aspect ratios", 20 or more crystal grains 31 are arbitrarily extracted from the large number of crystal grains 31 observed in the arbitrary section of the piezoelectric/electrostrictive body 30 in the thickness direction, the respective aspect ratios (W/T) of the extracted crystal grains 31 are calculated, and the average value of the ratios is calculated.

The piezoelectric/electrostrictive body 30 of the present embodiment has a thickness of preferably 1 to 20 μm, more preferably 2 to 15 μm, especially preferably 3 to 10 μm. When the thickness of the piezoelectric/electrostrictive body 30 is less than 1 μm, the piezoelectric/electrostrictive body is excessively thin, and it becomes difficult to form the body. On the other hand, when the piezoelectric/electrostrictive body 30 has a thickness exceeding 20 μm, fluctuations of crystal grain diameters increase. As a result, the fluctuations of the piezoelectric/electrostrictive properties sometimes increase.

Moreover, in the piezoelectric/electrostrictive body of the present embodiment, an average value (hereinafter referred to simply as the "crystal grain number average value") of numbers of crystal grains in the thickness direction, observed in an arbitrary section in the thickness direction, is preferably 2 or less, more preferably 1.8 or less, especially preferably 1.5 or less. When the crystal gain number average value in the thickness direction exceeds 2, sufficient piezoelectric/electrostrictive properties are not exhibited in some case. It is to be noted that there is not any special restriction on a lower limit value of the crystal grain number average value in the thickness direction, but the value is substantially 1 or more.

Here, there will be described a method of measuring or calculating the crystal grain number average value in the thickness direction in the present specification with reference to FIG. 2. First, in the arbitrary section of the piezoelectric/electrostrictive body 30 in the thickness direction, 20 or more straight lines 35 are arbitrarily drawn in parallel with the thickness direction of the piezoelectric/electrostrictive body (In this respect, note that the number of the straight lines 35 is five for the sake of convenience of description in FIG. 2). Next, the number of the crystal grains 31 crossing the respective straight lines 35 is measured for each of the straight lines 35. For example, in FIG. 2, the numbers of the crystal grains crossing five straight lines 35 can be measured as four, five, five, four, and three from the straight line 35 on the left side of the figure. When the numbers of the crystal grains crossing the respective straight lines 35 are averaged, the "crystal grain number average value in the thickness direction" can be calculated. For example, in FIG. 2, the "crystal grain number average value in the thickness direction" can be measured or calculated as "4.2".

Typical examples of the piezoelectric/electrostrictive porcelain composition constituting the crystal grains include lead titanate zirconate. Furthermore, examples of lead titanate zirconate include:

(1) lead titanate zirconate constituted of a $PbMg_{1/3}Nb_{2/3}O_3$—$PbZrO_3$—$PbTiO_3$ ternary solid solution system composition;

(2) lead titanate zirconate containing as a main component the $PbMg_{1/3}Nb_{2/3}O_3$—$PbZrO_3$—$PbTiO_3$ ternary solid solution system composition, and containing 0.05 to 3% by mass of NiO; and (3) lead titanate zirconate constituted of a $Pb(Mg,Ni)_{1/3}Nb_{2/3}O_3$—$PbZrO_3$—$PbTiO_3$ ternary solid solution system composition. Here, in "containing as a main component the $PbMg_{1/3}Nb_{2/3}O_3$—$PbZrO_3$—$PbTiO_3$ ternary solid solution system composition", the "main component" indicates that a content of the $PbMg_{1/3}Nb_{2/3}O_3$—$PbZrO_3$—$PbTiO_3$ ternary solid solution system composition is 99.5% by mass or more, preferably 99.8% by mass or more of the whole piezoelectric/electrostrictive porcelain composition excluding NiO.

Moreover, the $PbMg_{1/3}Nb_{2/3}O_3$—$PbZrO_3$—$PbTiO_3$ ternary solid solution system composition, represented by the following composition formula (1);

$$Pb_x(Mg_{y/3}Nb_{2/3})_aTi_bZr_cO_3 \quad (1),$$

wherein $0.95 \leq x \leq 1.05$, $0.8 \leq y \leq 1.0$, and a, b, and c are decimals (additionally, a+b+c=1.00) in a range surrounded with (a, b, c)=(0.550, 0.425, 0.025), (0.550, 0.325, 0.125), (0.375, 0.325, 0.300), (0.050, 0.425, 0.525), (0.050, 0.525, 0.425), (0.375, 0.425, 0.200) in a coordinate including three coordinate axes of a, b, and c, is preferable because it is possible to obtain the piezoelectric/electrostrictive body having higher piezoelectric/electrostrictive properties.

Furthermore, the $Pb(Mg,Ni)_{1/3}Nb_{2/3}O_3$—$PbZrO_3$—$PbTiO_3$ ternary solid solution system composition, represented by the following composition formula (2);

$$Pb_x\{(Mg_{1-y}Ni_y)_{(1/3)\times a}Nb_{2/3}\}_bTi_cZr_dO_3 \quad (2),$$

wherein $0.95 \leq x \leq 1.05$, $0.05 \leq y \leq 0.20$, $0.90 \leq a \leq 1.10$, and b, c, and d are decimals (additionally, (b+c+d)=1.009) in a range surrounded with (b, c, d)=(0.550, 0.425, 0.025), (0.550, 0.325, 0.125), (0.375, 0.325, 0.300), (0.050, 0.425, 0.525), (0.050, 0.525, 0.425), (0.375, 0.425, 0.200) in a coordinate including coordinate axes of b, c, and d, is preferable because it is possible to obtain the piezoelectric/electrostrictive body having higher piezoelectric/electrostrictive properties.

Next, there will be described one embodiment of a piezoelectric/electrostrictive laminate of the present invention. In the present embodiment, the piezoelectric/electrostrictive laminate comprises a plurality of piezoelectric/electrostrictive bodies described above, and a plurality of film-like or layered electrodes. The plurality of piezoelectric/electrostrictive bodies is laminated alternately with the plurality of electrodes, and each piezoelectric/electrostrictive body is sandwiched between the electrodes. Therefore, in the present embodiment, the piezoelectric/electrostrictive laminate has superior piezoelectric/electrostrictive properties, and a larger displacement can be obtained as compared with a case where the piezoelectric/electrostrictive body has only one layer. In the present embodiment, the piezoelectric/electrostrictive laminate exhibits a sufficient durability even in the case where the flexural displacement is repeated a large number of times.

In the present embodiment, examples of a material of the electrode constituting the piezoelectric/electrostrictive laminate include at least one metal selected from a group consisting of Pt, Pd, Rh, Au, Ag, and an alloy of them. Above all, platinum or an alloy containing platinum as a main component is preferable because it has a high heat resistance during firing. It is to be noted that there is not any restriction on a dimension of the electrode.

Figure 3:
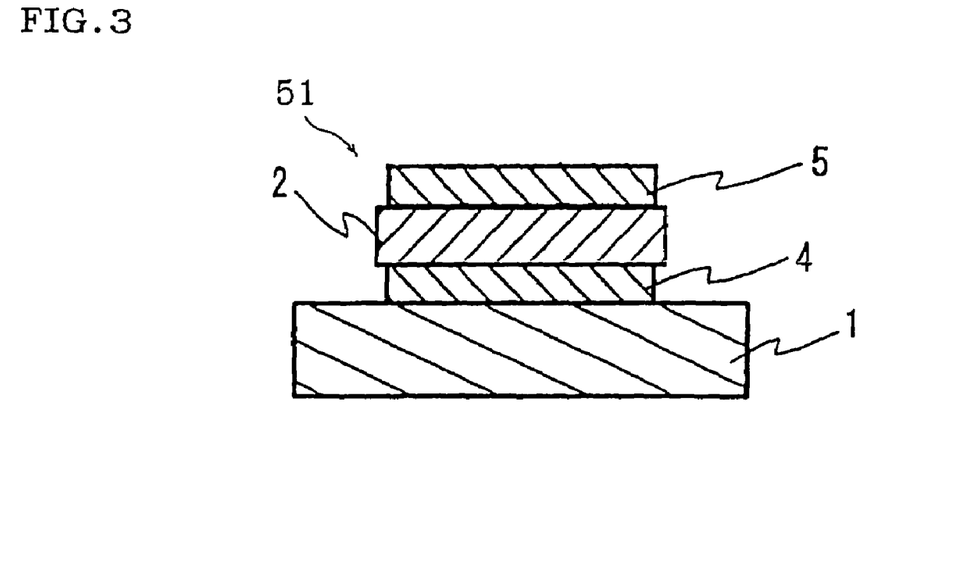
FIG. 3 is a sectional view schematically showing one embodiment of a piezoelectric/electrostrictive film type actuator of the present invention.

Next, an embodiment of a piezoelectric/electrostrictive film type actuator of the present invention will be described specifically with reference to the drawings. As shown in FIG. 3, in the present embodiment, a piezoelectric/electrostrictive film type actuator 51 comprises: a substrate 1 made of a ceramic; at least one piezoelectric/electrostrictive portion 2 disposed on the substrate 1; and a piezoelectric/electrostrictive driving portion having at least one pair of electrodes 4, 5 electrically connected to the piezoelectric/electrostrictive portion 2. The substrate 1 is displaced by driving of this piezoelectric/electrostrictive driving portion. It is to be noted that the piezoelectric/electrostrictive portion 2 is bonded onto the substrate 1 in a state in which the electrode 4 is interposed, but the piezoelectric/electrostrictive portion may be bonded directly onto the substrate without interposing any electrode. It is to be noted that a "bonded" state refers to a state in which the piezoelectric/electrostrictive portion 2 is closely integrated with the substrate 1 or the electrode 4 by a solid-phase reaction between them without using any organic or inorganic adhesive.

In the piezoelectric/electrostrictive film type actuator 51 of the present embodiment, the piezoelectric/electrostrictive portion 2 is constituted of any one of the piezoelectric/electrostrictive bodies described above. Therefore, the piezoelectric/electrostrictive film type actuator 51 of the present embodiment comprising the piezoelectric/electrostrictive portion 2 has superior piezoelectric/electrostrictive properties and can obtain a large displacement. The piezoelectric/electrostrictive film type actuator 51 of the present embodiment exhibits a sufficient durability even in the case where the flexural displacement is repeated a large number of times.

Figure 5:
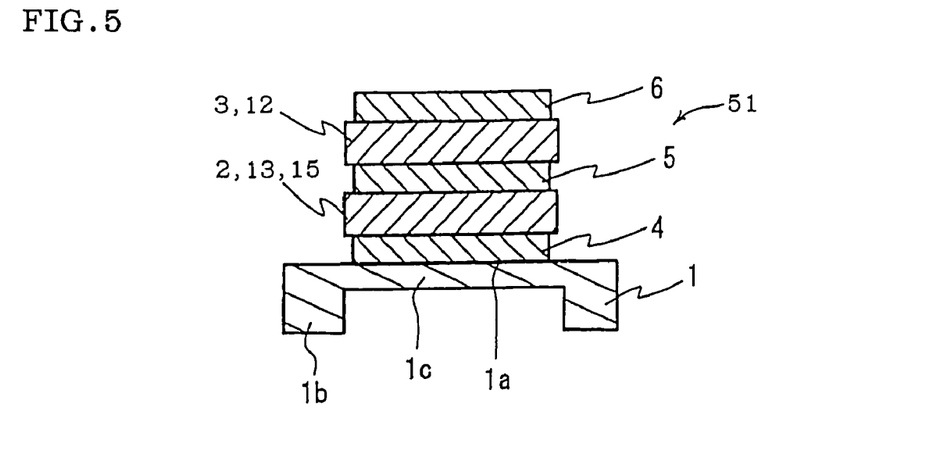
FIG. 5 is a sectional view schematically showing still another embodiment of the piezoelectric/electrostrictive film type actuator of the present invention.

Moreover, in the present embodiment, as shown in FIG. 5, the piezoelectric/electrostrictive film type actuator 51 comprises a plurality of piezoelectric/electrostrictive portions 2, 3, and a plurality of electrodes 4, 5, 6. The plurality of piezoelectric/electrostrictive portions 2, 3 are preferably constituted to be alternately sandwiched and laminated between the plurality of electrodes 4, 5, and 6. This constitution is a so-called multilayered constitution, and a large flexural displacement can be preferably obtained at a low voltage.

According to the embodiment of the present invention, the substrate constituting the piezoelectric/electrostrictive film type actuator is made of a ceramic, but there is not any special restriction on a ceramic type, but in respect of a heat resistance, a chemical stability, and an insulating property, the ceramic preferably contains at least one selected from a group consisting of stabilized zirconium oxide, aluminum oxide, magnesium oxide, mullite, aluminum nitride, silicon nitride, and glass. Above all, stabilized zirconium oxide is more preferable because it has a large mechanical strength and a superior tenacity. It is to be noted that "stabilized zirconium oxide" mentioned in the present invention refers to zirconium oxide in which phase transition of a crystal is inhibited by addition of a stabilizer, and includes partially stabilized zirconium oxide in addition to stabilized zirconium oxide.

Examples of stabilized zirconium oxide include zirconium oxide containing, as the stabilizer, 1 to 30 mol % of calcium oxide, magnesium oxide, yttrium oxide, scandium oxide, ytterbium oxide, cerium oxide, or oxide of a rare earth metal. Above all, it is preferable to contain yttrium oxide as the stabilizer because a vibrating portion needs to have an especially high mechanical strength. In this case, preferably 1.5 to 6 mol %, more preferably 2 to 4 mol % of yttrium oxide is contained. Furthermore, 0.1 to 5 mol % of aluminum oxide is preferably contained. A crystal phase of stabilized zirconium oxide may be a mixed phase of a cubic form+a monoclinic form, a mixed phase of a tetragonal form+the monoclinic form, a mixed phase of the cubic form+the tetragonal form+the monoclinic form or the like, and a main crystal phase is preferably the tetragonal form or a mixed phase of the tetragonal form+the cubic form from viewpoints of strength, tenacity, and durability.

It is to be noted that the substrate has a thickness of preferably 1 μm to 1 mm, more preferably 1.5 to 500 μm, especially preferably 2 to 200 μm. When the thickness of the substrate is less than 1 μm, the mechanical strength of the piezoelectric/electrostrictive film type actuator sometimes drops. On the other hand, when the thickness exceeds 1 mm, a rigidity of the substrate against a generated contraction stress increases in a case where the voltage is applied to the piezoelectric/electrostrictive portion. The flexural displacement of the piezoelectric/electrostrictive portion is sometimes reduced.

Figure 4:
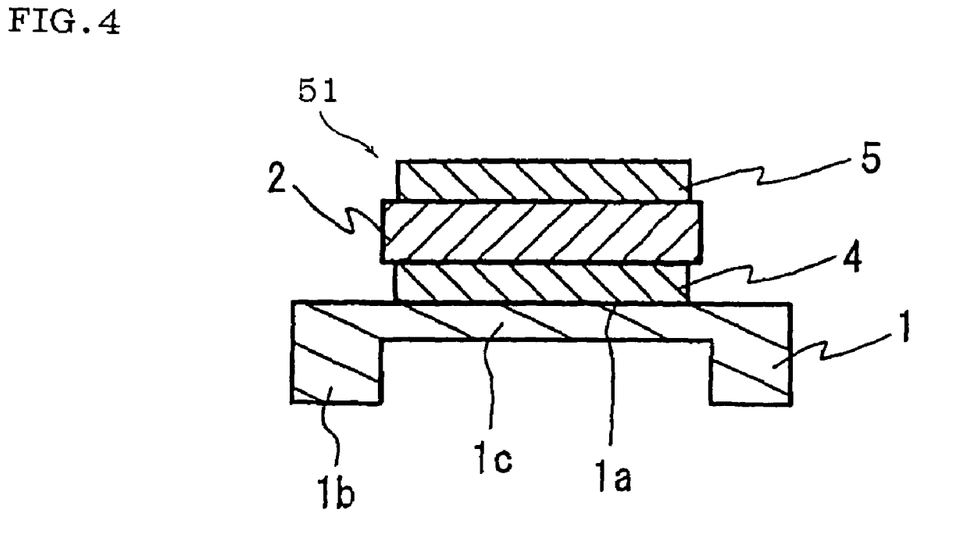
FIG. 4 is a sectional view schematically showing another embodiment of the piezoelectric/electrostrictive film type actuator of the present invention.
Figure 6:
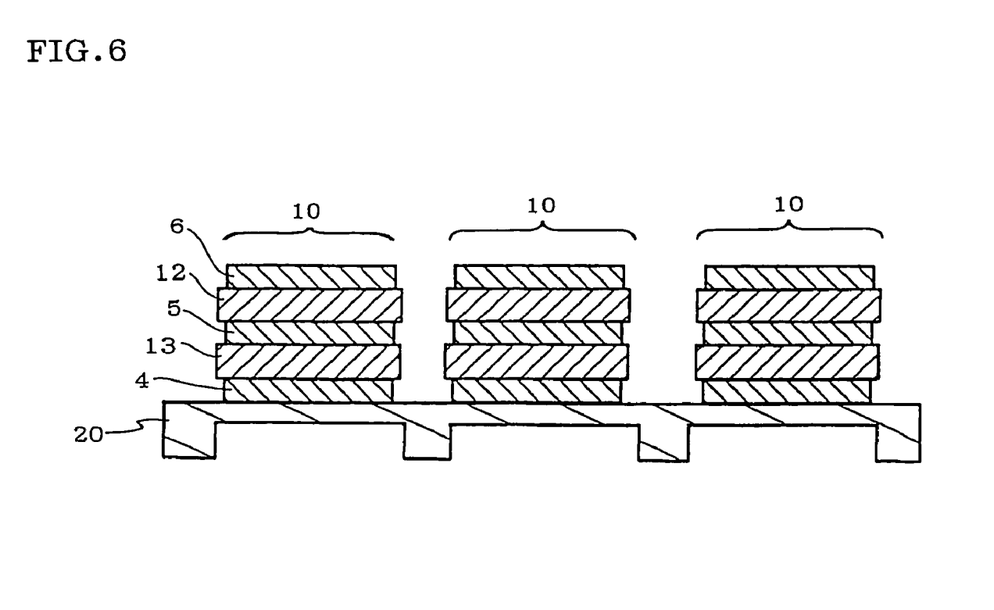
FIG. 6 is a sectional view schematically showing a further embodiment of the piezoelectric/electrostrictive film type actuator of the present invention.

In addition, as shown in FIG. 4, the substrate 1 may have a shape comprising: a thin portion 1c provided with a bonding surface 1a formed on one surface thereof and having the above-described thickness; and a thick portion 1b disposed in a portion other than a portion corresponding to the bonding surface 1a and having a thickness larger than that of the thin portion 1c. It is to be noted that the electrode 4 (or the piezoelectric/electrostrictive portion) is disposed in a region substantially corresponding to the bonding surface 1a. When the substrate 1 has such shape, it is possible to constitute the piezoelectric/electrostrictive film type actuator having sufficiently large flexural displacement and mechanical strength. As shown in FIG. 6, a common substrate 20 may be used in which the shape of the substrate 1 shown in FIG. 4 is continuously formed. A plurality of piezoelectric/electrostrictive driving portion units 10 may be disposed on the common substrate 20, and each of the units includes a first piezoelectric/electrostrictive portion 12, a second piezoelectric/electrostrictive portion 13, and electrodes 4, 5, and 6.

There is not any special restriction on a surface shape (shape of a surface to which the electrode 4 is bonded in FIG. 3) of the substrate in the piezoelectric/electrostrictive film type actuator according to the embodiment of the present invention, and examples of the surface shape include a rectangular shape, a square shape, a triangular shape, an elliptic shape, a perfect circle shape, a square shape with a curvature, a rectangular shape with a curvature, and a composite shape obtained by combining these shapes. There is not any special restriction on the shape of the whole substrate, and the substrate may have a capsule shape having an appropriate internal space.

Figure 9:
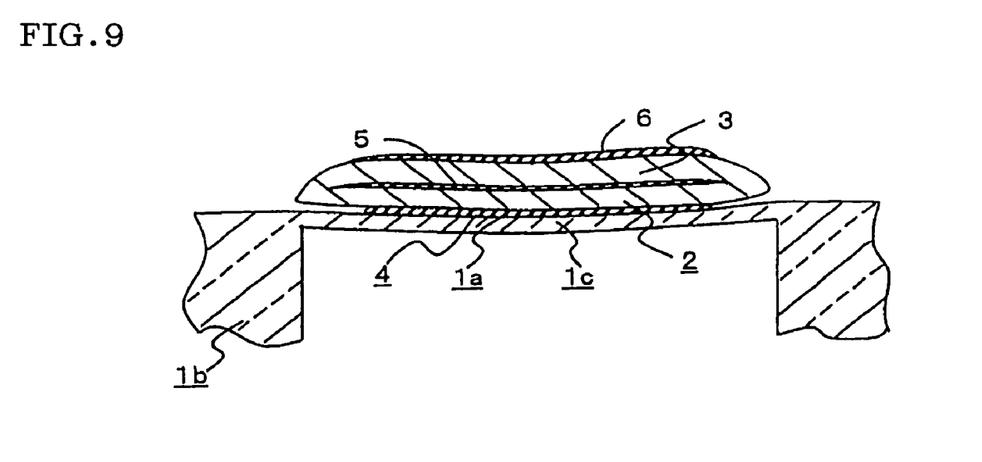
FIG. 9 is a sectional view showing another typical example of the embodiment shown in FIG. 5.
Figure 10:
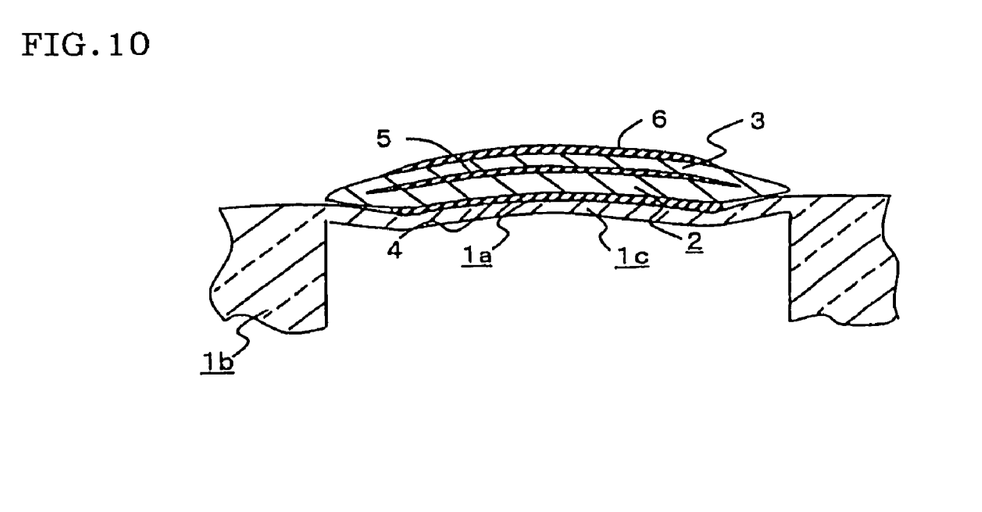
FIG. 10 is a sectional view showing still another typical example of the embodiment shown in FIG. 5.

Moreover, as a shape of the thin portion of the substrate, as shown in FIG. 9, a central portion is preferably bent on a side opposite to a surface on which the piezoelectric/electrostrictive portions 2, 3 are disposed because the shape has a high linearity of the flexural displacement with respect to an electric field. Alternatively, as shown in FIG. 10, a sectional shape in a thickness direction is preferably a so-called W-shape in which opposite end portions of the substrate protrude in a vertical direction on a bottom-portion side as viewed from a central line of the substrate in a longitudinal direction, and the central portion protrudes upwards. It is to be noted that the bent shape shown in FIG. 9 can be formed by utilizing contraction in a step of firing the respective piezoelectric/electrostrictive portions 2, 3. The W-shape shown in FIG. 10 can be formed by adjusting a firing contraction start timing or a firing contraction amount of each of the piezoelectric/electrostrictive portions 2 and 3, or the shape of the thin portion 1c.

In the piezoelectric/electrostrictive film type actuator of the present embodiment, the electrode is electrically connected to the piezoelectric/electrostrictive portion, and is disposed between the respective piezoelectric/electrostrictive portions. The electrode is preferably disposed in such a manner as to include a region of the piezoelectric/electrostrictive portion that substantially contributes to the flexural displacement or the like. For example, as shown in FIG. 5, each of the electrodes 4, 5, and 6 is preferably disposed on a region having an area of 80% or more of the surface including the vicinity of the central portion and provided with the first piezoelectric/electrostrictive portion 12 or the second piezoelectric/electrostrictive portion 13.

Figure 7A:
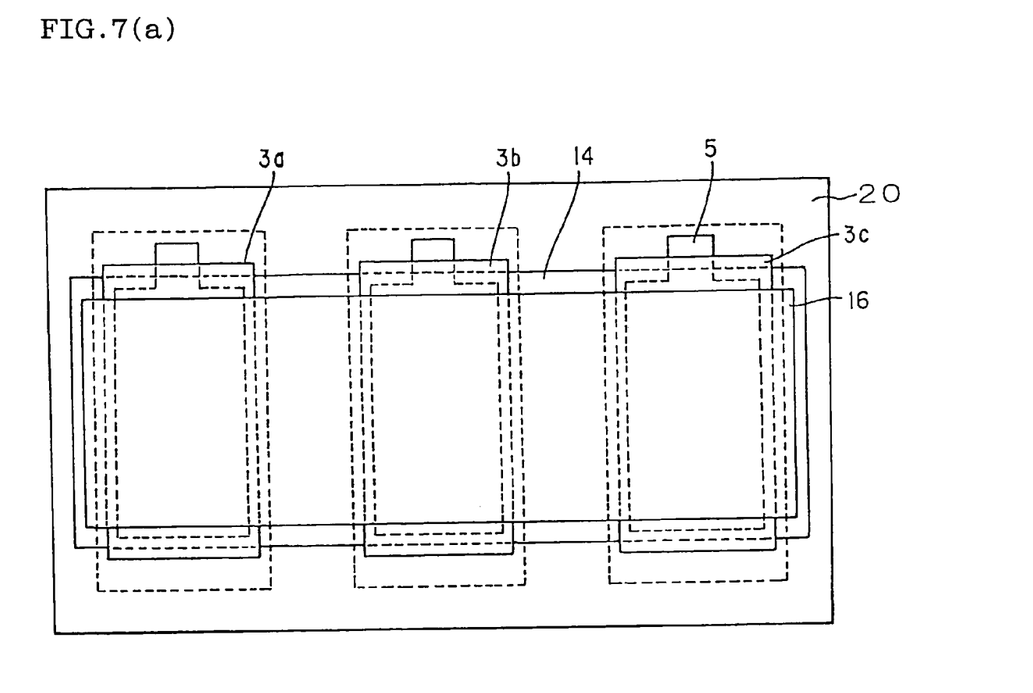
Figure 7B:
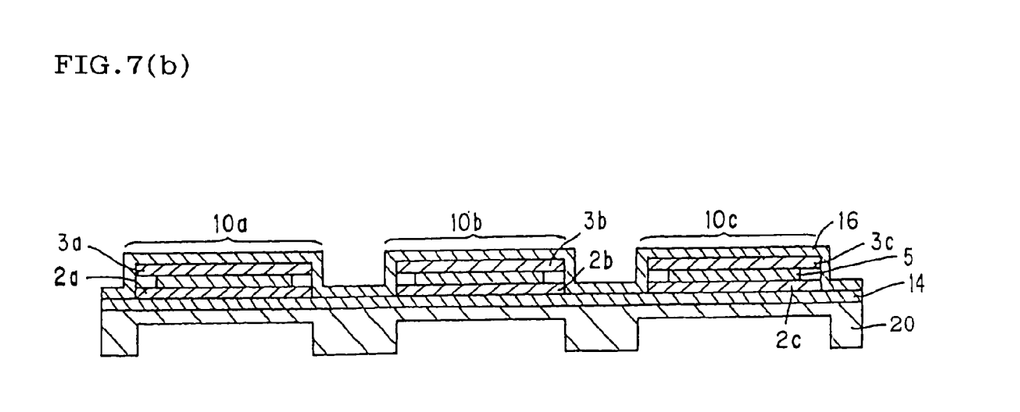

Moreover, in a case where a plurality of piezoelectric/electrostrictive driving portion units 10a to 10c share a common substrate 20 as shown in FIGS. 7(a), 7(b), a lowermost-layer electrode 14 and an uppermost-layer electrode 16 in the respective piezoelectric/electrostrictive driving portion units 10a to 10c are shared by the respective piezoelectric/electrostrictive driving portion units 10a to 10c. The electrode 14 may be of an integral type disposed in a region corresponding to piezoelectric/electrostrictive portions 2a to 2c, 3a to 3c. Such integrated, electrode 14 does not have to be formed into a shape corresponding to the individual piezoelectric/electrostrictive portions 2a to 2c, 3a to 3c, and positioning is facilitated in forming the electrodes.

Figure 8:
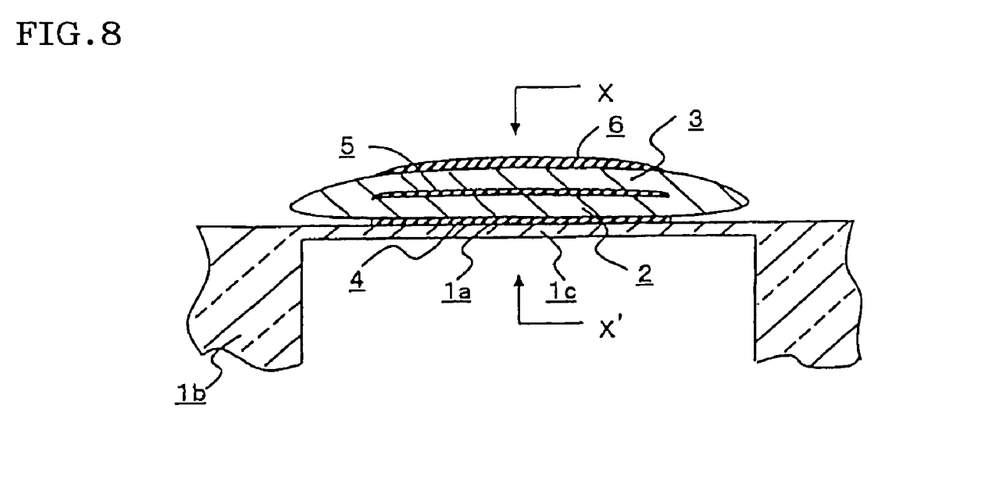
FIG. 8 is a sectional view showing a typical example of the embodiment shown in FIG. 5.
Figure 11:
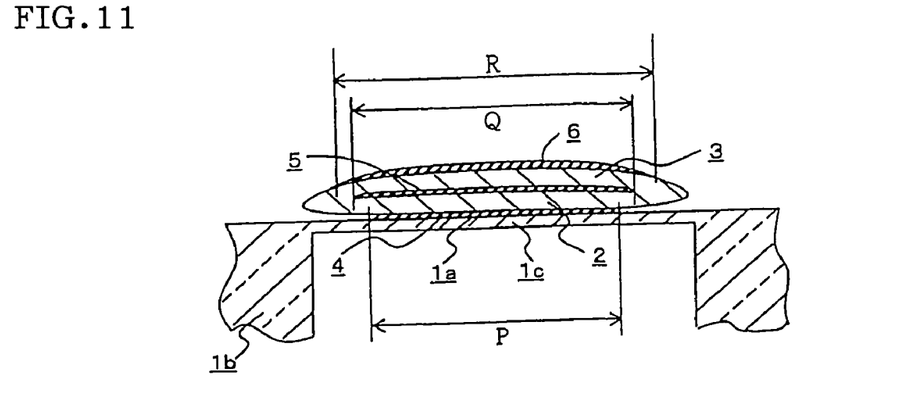
FIG. 11 is a sectional view showing a further typical example of the embodiment shown in FIG. 5.
Figure 14A:
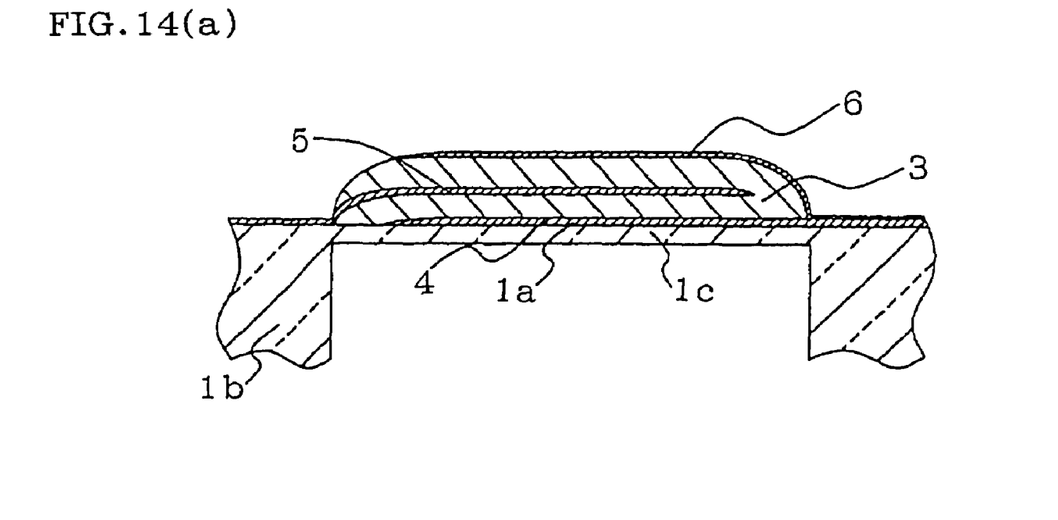
Figure 14B:
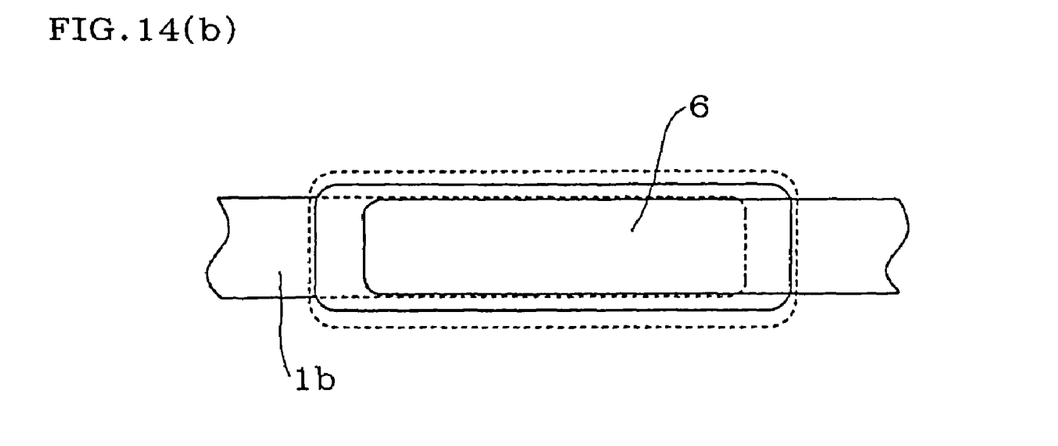

In the piezoelectric/electrostrictive film type actuator of the present embodiment, an example of a material of the electrode is at least one metal selected from a group consisting of Pt, Pd, Rh, Au, Ag, and an alloy of them. Above all, platinum or an alloy containing platinum as a main component is preferable because it has a high heat resistance during the firing of the piezoelectric/electrostrictive portion. There is not any special restriction on a dimension of the electrode. For example, as shown in FIGS. 8, 14(a), and 14(b), widths of the respective electrodes 4, 5, and 6 are set to be equal, and the respective electrodes 4, 5, and 6 may be disposed in positions corresponding to one another in a width direction. Alternatively, as shown in FIG. 11, each of the electrodes 4, 5, and 6 is preferably disposed in a broader region including a region corresponding to the electrode positioned in a lower layer successively from the electrode 4 positioned in a lowermost layer. According to this constitution, since the piezoelectric/electrostrictive portion positioned in an upper layer can be distorted more than the piezoelectric/electrostrictive portion positioned in a lower layer, a bending efficiency can be enhanced, and the flexural displacement can be developed more effectively.

Figure 12:
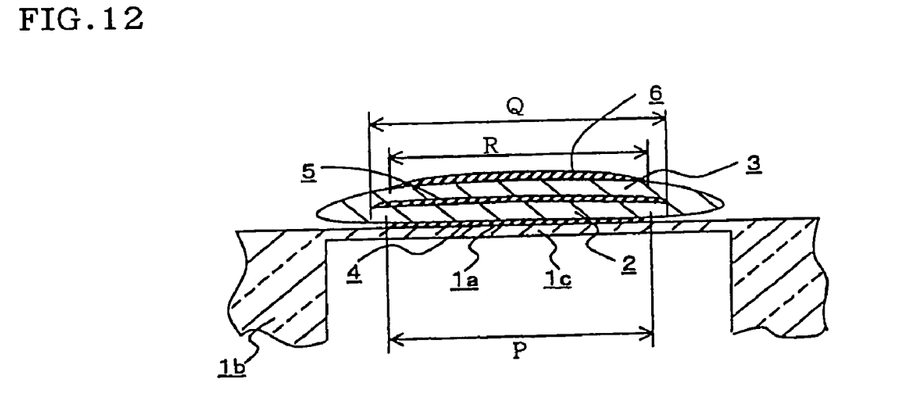
FIG. 12 is a sectional view showing a further typical example of the embodiment shown in FIG. 5.
Figure 13:
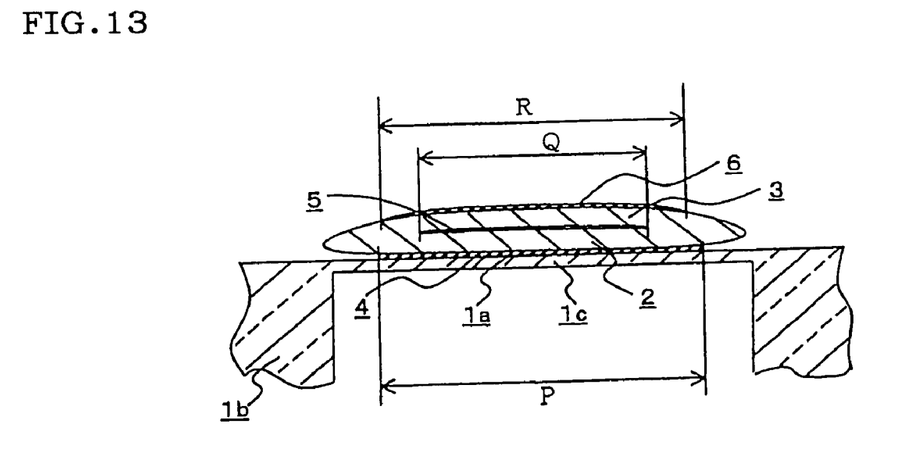
FIG. 13 is a sectional view showing a still further typical example of the embodiment shown in FIG. 5.

In addition, in a case where a large flexural displacement is obtained by enhancing a driving voltage of the piezoelectric/electrostrictive film type actuator, as shown in FIG. 12, the intermediately positioned electrode 5 is preferably disposed in a region broader than that of the electrode 4 or 6 positioned in the lower or upper layer. Alternatively, as shown in FIG. 13, the intermediately positioned electrode 5 is preferably disposed in a region smaller than that of the electrode 4 or 6. According to this constitution, an electric field is hardly applied to the vicinity of an end portion of the piezoelectric/electrostrictive portion 2 or 3, whose thickness (short direction) is easily reduced, and it is possible to avoid dielectric breakdowns of the piezoelectric/electrostrictive portions 2, 3. In a case where a breadth difference is made in the region in which the electrode is disposed, the breadth difference is preferably optimized in consideration of an electric field distribution. For example, between the electrode 4 and 5 (or 5 and 6) disposed adjacent to each other via the piezoelectric/electrostrictive portion 2 (or 3), a value of a ratio of an area (area of a forming surface) in which the electrode is disposed is preferably 0.5 to 2, more preferably 0.67 to 1.5, especially preferably 0.83 to 1.2. It is to be noted that in FIGS. 11 to 13, symbol P denotes a width of a lower electrode, Q denotes a width of an intermediate electrode, and R denotes a width of an upper electrode.

In the piezoelectric/electrostrictive film type actuator of the present embodiment, a thickness of the electrode is preferably 15 µm or less, more preferably 5 µm or less. When the thickness exceeds 15 µm, the electrode functions as a relaxation layer, and the flexural displacement is sometimes reduced. It is to be noted that the thickness of the electrode may be 0.05 µm or more from a viewpoint that a substantial function of the electrode be exhibited.

Next, a method of manufacturing a piezoelectric/electrostrictive body will be described according to the embodiment of the present invention. According to the present embodiment, the piezoelectric/electrostrictive body can be manufactured by firing a piezoelectric/electrostrictive porcelain composition. To prepare the piezoelectric/electrostrictive porcelain composition, first there is weighed a raw material such as an oxide of each of elements PbO, MgO, $Nb_2O_5$, $TiO_2$, $ZrO_2$, and NiO, or carbonate in order to obtain a desired composition. The material is mixed with some water by a mixing method such as ball milling to obtain a mixed slurry. Next, the resultant mixed slurry can be dried by using a drier or a filter to obtain a mixed material. The resultant mixed material can be calcined and crushed to thereby prepare the piezoelectric/electrostrictive porcelain composition having desired particle diameters. It is to be noted that calcining may be performed at a temperature of 750 to 1300° C. The crushing may be performed by a method such as the ball milling. As to the prepared piezoelectric/electrostrictive porcelain composition, a ratio of a strength of a strongest diffraction line of a pyrochlore phase to that of a strongest diffraction line of a perovskite phase in the diffraction strength measured by an X-ray diffraction device is preferably 5% or less, more preferably 2% or less.

Moreover, the piezoelectric/electrostrictive porcelain composition has an average particle diameter of preferably 0.07 to 1 µm, more preferably 0.1 to 0.7 µm. It is to be noted that the particle diameter may be adjusted by a thermal treatment of a powder of the piezoelectric/electrostrictive porcelain composition at 400 to 750° C. In this case, finer particles are integrated with other particles to constitute a powder having uniformed particle diameters, and the piezoelectric/electrostrictive body having the uniformed particle diameters can be preferably formed. The piezoelectric/electrostrictive porcelain composition may be prepared by, for example, an alkoxide method, a co-precipitation method or the like.

After adding a plasticizer, a dispersant, a solvent or the like to the resultant powdered piezoelectric/electrostrictive porcelain composition to form the slurry using a general mixing device such as a ball mill, the composition can be molded into a sheet by a general molding machine such as a doctor blade. The sheet-like molded body can be sintered at 800 to 1300° C. for one minute to ten hours to obtain a sintered body. Next, an electrode is formed if necessary, and a polarization treatment can be performed to manufacture the piezoelectric/electrostrictive body of the present embodiment.

It is to be noted that to obtain the piezoelectric/electrostrictive body having a flat crystal grain ratio of 70% or more, and the piezoelectric/electrostrictive body whose average value of aspect ratios of the crystal grains is 1.3 or more, when a film-like laminate or a layered laminate having one or more layers is sintered, an atmosphere adjusting material having the same composition as the piezoelectric/electrostrictive porcelain composition is allowed to coexist in a container for the sintering. Moreover, an amount per space unit volume of this atmosphere adjusting material included in the container may be adjusted. To obtain the piezoelectric/electrostrictive body whose crystal grain number average value in the thickness direction is 2 or less, when a slurried piezoelectric/electrostrictive porcelain composition is molded into the film-like laminate or the layered laminate having one or more layers to obtain a molded body, the thickness of the molded body may be adjusted in such a manner that the thickness becomes excessively large, although this depends on the particle diameters of the piezoelectric/electrostrictive porcelain composition for use.

The sheet-like molded body is prepared alternately with formation of the electrode a plurality of times. Alternatively, a plurality of sheet-like molded bodies each provided with the electrode is laminated so that a piezoelectric/electrostrictive laminate of the present embodiment can be manufactured. After the sintering, the polarization treatment is performed on appropriate conditions. The polarization treatment is preferably performed by heating as in a known method. A heating temperature depends on Curie point of a piezoelectric/electrostrictive porcelain, but is preferably set to 40 to 200° C.

Next, a method of manufacturing a piezoelectric/electrostrictive film type actuator will be described according to the embodiment of the present invention. First, a layer constituted of the piezoelectric/electrostrictive porcelain composition is formed on a substrate made of a ceramic, or an electrode formed on a substrate surface. Examples of a method of forming the electrode include ion beam, sputtering, vacuum evaporation, PVD, ion plating, CVD, plating, aerosol deposition, screen printing, spraying, and dipping. Above all, a sputtering process or a screen printing process is preferable in respect of bondability with respect to the substrate and a piezoelectric/electrostrictive portion. As to the formed electrode, an appropriate temperature is selected depending on a material of the electrode, and the electrode can be integrated with the substrate and/or the piezoelectric/electrostrictive portion by a thermal treatment at about 800 to 1400° C. The thermal treatment may be performed every time the electrode is formed, or may be performed together with the sintering of the layer constituted of the piezoelectric/electrostrictive porcelain composition. In addition, after forming the layer constituted of the piezoelectric/electrostrictive porcelain composition, the thermal treatment is not performed at a temperature which exceeds the sintering temperature of the layer constituted of the piezoelectric/electrostrictive porcelain composition.

Examples of a method of forming the layer constituted of the piezoelectric/electrostrictive porcelain composition on the substrate include ion beam, sputtering, vacuum evaporation, PVD, ion plating, CVD, plating, sol-gel, aerosol deposition, screen printing, spraying, and dipping. Above all, a screen printing process is preferable because the layer can be easily and continuously formed into a high-precision shape and thickness. It is to be noted that in order to prepare the piezoelectric/electrostrictive film type actuator which is provided with a plurality of piezoelectric/electrostrictive portions and electrodes and in which they are alternately sandwiched and laminated, the electrode is formed on the layer formed on the substrate and constituted of the piezoelectric/electrostrictive porcelain composition by a method similar to the above-described method. It is to be noted that on this electrode, the layer constituted of the piezoelectric/electrostrictive porcelain composition, and the electrode are alternately and repeatedly formed until a desired multilayered constitution is obtained.

Thereafter, there is integrally sintered a laminate obtained by alternately laminating the layers constituted of the piezoelectric/electrostrictive porcelain compositions, and the electrodes on the substrate. By the sintering, the piezoelectric/electrostrictive portion constituted of crystal grains formed of the piezoelectric/electrostrictive porcelain composition can be bonded onto the substrate directly or via the electrode. It is to be noted that the sintering does not have to be necessarily integrally performed, and may be successively performed every time one layer constituted of the piezoelectric/electrostrictive porcelain composition is formed. However, from a viewpoint of production efficiency, the laminate including the electrodes is preferably sintered integrally.

In this case, the sintering temperature is preferably 800 to 1350° C., more preferably 900 to 1300° C. When the temperature is less than 800° C., the bonding of the substrate or the electrode with respect to the piezoelectric/electrostrictive portion becomes incomplete, or denseness of the piezoelectric/electrostrictive portion sometimes becomes insufficient. On the other hand, when the temperature exceeds 1350° C., it is sometimes difficult to form the piezoelectric/electrostrictive portion having a desired composition. A maximum temperature retention time at a sintering time is preferably one minute or more and ten hours or less, more preferably five minutes or more and four hours or less. When the maximum temperature retention time is less than one minute, the piezoelectric/electrostrictive portion is insufficiently densified, and desired properties are not obtained in some case. When the maximum temperature retention time exceeds ten hours, the piezoelectric/electrostrictive properties sometimes drop.

Thereafter, a polarization treatment is performed on appropriate conditions. The polarization treatment is preferably performed by the heating as in a known method. The heating temperature depends on Curie point of the piezoelectric/electrostrictive porcelain, but is preferably set to 40 to 200° C.

EXAMPLES

The present invention will be described hereinafter specifically based on examples, but the present invention is not limited to the examples. A method of measuring various types of physical property values will be described hereinafter.

[Flat crystal grain ratio]: A piezoelectric/electrostrictive body was cut in a thickness direction in an arbitrary position to expose a section. If necessary, etching or the like was performed. Thereafter, the section was observed with a microscope, and a "flat crystal grain ratio (%)" was calculated.

[Average value of aspect ratios]: A piezoelectric/electrostrictive body was cut in a thickness direction in an arbitrary position to expose a section. If necessary, etching or the like was performed. Thereafter, the section was observed with a microscope, 20 or more crystal grains were arbitrarily extracted, aspect ratios (W/T) of the respective extracted crystal grains were calculated, and an average value of them was calculated as an "average value of the aspect ratios".

[Crystal grain number average value in thickness direction]: A piezoelectric/electrostrictive body was cut in a thickness direction in an arbitrary position to expose a section. If necessary, etching or the like was performed. Thereafter, the section was observed with a microscope, and 20 or more straight lines were arbitrarily drawn in parallel with the thickness direction. The number of the crystal grains crossing each straight line was measured for each straight line, and an average value of them was calculated as the "crystal grain number average value in the thickness direction".

[Flexural displacement]: A voltage was applied between electrodes of a piezoelectric/electrostrictive film type actuator in such a manner as to obtain an electric field of 3 kV/mm, and a generated flexural displacement (μm) was measured with a laser displacement measuring device.

[Durability test]: As to each of the examples, 100 samples were prepared, driving was performed at an applied voltage of 0 to 3 kV/mm and a frequency of 1 kHz, and a flexural displacement of each sample was measured initially (0 cycle) and after the driving for $10^9$ cycles. The number of the samples was measured in which a value of the flexural displacement after the $10^9$ cycle driving was 90% or less of that of the initial flexural displacement.

Examples 1 to 3, Comparative Examples 1, 2

A lower electrode (dimension: 1.2×0.8 mm, thickness: 3 μm) made of Pt was formed by a screen printing process on a $ZrO_2$ substrate (dimension of a thin portion: 1.6×1.1 mm, thickness: 7 μm) stabilized with $Y_2O_3$ and having a smooth thin portion, and the electrode was integrated with the substrate by a thermal treatment at 1300° C. for two hours. Next, on the integrated electrode, a piezoelectric material constituted of a piezoelectric porcelain composition containing 98.5% by mass of $Pb_{1.00}(Mg_{1/3}Nb_{2/3})_{0.20}Ti_{0.43}Zr_{0.37}O_3$ and 1.5% by mass of NiO was formed into a film having a dimension of 1.3×0.9 mm and a thickness of 8 μm. The resultant film was placed in a container whose atmosphere was adjusted by allowing an atmosphere adjusting material having the same composition as the piezoelectric porcelain composition to coexist in such a manner that an amount of the atmosphere adjusting material included per in-container space unit volume indicated a value shown in Table 1. A thermal treatment (sintering) was performed at 1275° C. for two hours. A thickness of each thermally treated piezoelectric portion was 5.1 μm. Next, after forming an upper electrode (dimension: 1.2× 0.8 mm, thickness: 0.5 μm) made of Au on the piezoelectric portion by the screen printing process, the thermal treatment was performed to manufacture each piezoelectric film type actuator (Examples 1 to 3, Comparative Examples 1, 2) having a film-like piezoelectric driving portion. Measurement results of physical property values and flexural displacements of the manufactured piezoelectric film type actuators are shown in Table 1.

TABLE 1

| | Content of atmosphere adjusting material (mg/cm³) | Flat crystal grain ratio (%) | Average value of aspect ratios (W/T) | Flexural displacement (μm) | Durability Test (samples) |
|---|---|---|---|---|---|
| Exam. 1 | 10.0 | 75 | 1.21 | 2.10 | 0 |
| Exam. 2 | 8.7 | 83 | 1.32 | 2.24 | 0 |
| Exam. 3 | 7.3 | 88 | 1.55 | 2.33 | 0 |
| Com. Exam. 1 | 13.3 | 63 | 1.03 | 1.90 | 1 |
| Com. Exam. 2 | 16.7 | 53 | 0.99 | 1.87 | 3 |

From the results shown in Table 1, it is apparent that the piezoelectric film type actuators of Examples 1 to 3 having a flat crystal grain ratio of 70% or more can obtain a large flexural displacement and are superior in durability as compared with the piezoelectric film type actuators of Comparative Examples 1, 2 having a flat crystal grain ratio which is less than 70%. It is also apparent that a larger flexural displacement can be obtained when the average value of aspect ratios (W/T) increases.

Example 4

A piezoelectric film type actuator (Example 4) was manufactured in the same manner as in Examples 1 to 3 and Comparative Examples 1, 2 described above except that laminating and thermal treating of piezoelectric materials were repeated by a screen printing process eight times. It is to be noted that thermal treatment conditions are similar to those of Example 3. Measurement results of physical property values and flexural displacement of the manufactured piezoelectric film type actuator are shown in Table 2.

TABLE 2

| | Flat crystal grains ratio (%) | Average value of aspect ratios (W/T) | Thickness (μm) | Flexural displacement (μm) |
|---|---|---|---|---|
| Example 3 | 88 | 1.55 | 5.1 | 2.33 |
| Example 4 | 75 | 1.28 | 21.0 | 2.19 |

From the results shown in Table 2, it is apparent that when the thickness of the piezoelectric portion exceeds 20 μm, a size of the resultant flexural displacement tends to be gradually decreased.

Example 5

A piezoelectric film type actuator (Example 5) was manufactured in the same manner as in Examples 1 to 3 and Comparative Examples 1, 2 described above except that a piezoelectric material was laminated in a thickness of 10 μm by a screen printing process. It is to be noted that thermal treatment conditions are similar to those of Example 2. Measurement results of physical property values and flexural displacement of the manufactured piezoelectric film type actuator are shown in Table 3.

Example 6

A piezoelectric film type actuator (Example 6) was manufactured in the same manner as in Examples 1 to 3 and Comparative Examples 1, 2 described above except that after laminating and thermally treating a piezoelectric material in a thickness of 5 μm by a screen printing process, the piezoelectric material was again laminated and thermally treated in a thickness of 5 μm. It is to be noted that thermal treatment conditions are similar to those of Example 2. Measurement results of physical property values and flexural displacement of the manufactured piezoelectric film type actuator are shown in Table 3.

TABLE 3

| | Flat crystal grain ratio (%) | Average value of aspect ratios (W/T) | Average value of crystal grains in thickness direction | Thickness (μm) | Number of laminating and thermal treating times | Flexural Displacement (μm) |
|---|---|---|---|---|---|---|
| Exam. 5 | 83 | 1.3 | 1.7 | 6.2 | 1 | 2.21 |
| Exam. 6 | 78 | 1.25 | 2.3 | 6.1 | 2 | 2.12 |

From the results shown in Table 3, it is apparent that when the average value of crystal grain numbers in the thickness direction is 2 or less, a larger flexural displacement is obtained.

Example 7

A piezoelectric film type actuator (Example 7) was manufactured in the same manner as in Examples 1 to 3 and Comparative Examples 1, 2 except that after laminating piezoelectric materials in a thickness of 5 μm by a screen printing process, an upper electrode made of Pt, and a piezoelectric material having a thickness of 5 μm were formed by the screen printing process before a thermal treatment was performed. It is to be noted that thermal treatment conditions are similar to those of Example 2. Measurement results of physical property values and flexural displacement of the manufactured piezoelectric film type actuator are shown in Table 4.

TABLE 4

| | Flat crystal grain ratio (%) | Average value of aspect ratios (W/T) | Number of piezoelectric layers | Thickness (μm) | Flexural Displacement (μm) |
|---|---|---|---|---|---|
| Exam. 5 | 83 | 1.30 | 1 | 6.2 | 2.21 |
| Exam. 7 | 85 | 1.39 | 2 | 6.1 | 2.29 |

From the results shown in Table 4, it is apparent that when the number of laminates of a piezoelectric body increases, a larger flexural displacement is obtained.

A piezoelectric/electrostrictive body, a piezoelectric/electrostrictive laminate, and a piezoelectric/electrostrictive film type actuator of the present invention are favorably used in a probe moving mechanism of a scanning type tunnel microscope, a rectilinear guide mechanism in an ultra-precision working device, a servo valve for a hydraulic control, a head of a VTR device, a pixel constituting a flat panel type image display device, a head of an ink jet printer or the like.

What is claimed is:

1. A piezoelectric/electrostrictive body comprising a large number of crystal grains having piezoelectric/electrostrictive properties and being one of:

(1) a $PbMg_{1/3}Nb_{2/3}O_3$—$PbZrO_3$—$PbTiO_3$ ternary solid solution system composition represented by the formula $Pb_x(Mg_{y/3}Nb_{2/3})_aTi_bZr_cO_3$, wherein $0.95 \leq x \leq 1.05$, $0.8 \leq y \leq 1.0$, and a, b, and c are decimals (additionally, a+b+c=1.00) in a range surrounded with (a, b, c)=(0.550, 0.425, 0.025), (0.550, 0.325, 0.125), (0.375, 0.325, 0.300), (0.050, 0.425, 0.525), (0.050, 0.525, 0.425), (0.375, 0.425, 0.200) in a coordinate including three coordinate axes of a, b, and c;

(2) a lead titanate zirconate containing as a main component the $PbMg_{1/3}Nb_{2/3}O_3$—$PbTiO_3$ ternary solid solution system composition in (1) and containing 0.05 to 3% by mass of NiO; and (3) a $Pb(Mg, Ni)_{1/3}Nb_{2/3}O_3$—$PbZrO_3$—$PbTiO_3$ ternary solid solution system composition represented by the formula $Pb_x\{(Mg_{1-y}Ni_y)_{(1/3)}x_aNb_{2/3}\}_bTi_cZr_dO_3$, wherein $0.95 \leq x \leq 1.05$, $0.05 \leq y \leq 0.20$, $0.90 \leq a \leq 1.10$, and b, c, and d are decimals (additionally, b+c+d=1.00) in a range surrounded with (b, c, d)=(0.550, 0.425, 0.025), (0.550, 0.325, 0.125), (0.375, 0.325, 0.300), (0.050, 0.425, 0.525), (0.050, 0.525, 0.425), (0.375, 0.425, 0.200) in a coordinate including coordinate axes of b, c, and d, wherein the crystal grains are arranged in a film or layer having a thickness direction and a width direction perpendicular to the thickness direction, wherein each of the crystal grains, as observed in an arbitrary section in the thickness direction of the film or layer, has a width measured along the width direction of the film or layer, and has a thickness measured along the thickness direction of the film or layer, wherein the width of each crystal grain is greater than the thickness thereof in a portion of the large number of crystal grains, and wherein a number ratio of the portion to the large number of crystal grains is 70% or more as observed in the arbitrary section in the thickness direction of the film or layer.

2. The piezoelectric/electrostrictive body according to claim 1, wherein an average value of ratios (W/T) of the width (W) of the crystal grains in the width direction to the thickness (T) of the crystal grains in the thickness direction is 1.3 or more as observed in the arbitrary section in the thickness direction.

3. The piezoelectric/electrostrictive body according to claim 1, wherein a thickness of the film or layer measured along the thickness direction is in a range of 1 to 20 μm.

4. The piezoelectric/electrostrictive body according to claim 1, wherein an average value of the numbers of the crystal grains in the thickness direction, as observed in the arbitrary section in the thickness direction, is 2 or less.

5. A piezoelectric/electrostrictive laminate comprising: a plurality of piezoelectric/electrostrictive bodies, and a plurality of film-like or layer-like electrodes each piezoelectric/electrostrictive body comprising:

a large number of crystal grains having piezoelectric/electrostrictive properties and being one of:

(1) a $PbMg_{1/3}Nb_{2/3}O_3$—$PbZrO_3$—$PbTiO_3$ ternary solid solution system composition represented by the formula $Pb_x(Mg_{y/3}Nb_{2/3})_aTi_bZr_cO_3$, wherein $0.95 \leq x \leq 1.05$, $0.8 \leq y \leq 1.0$, and a, b, and c are decimals (additionally, a+b+c=1.00) in a range surrounded with (a, b, c)=(0.550, 0.425, 0.025), (0.550, 0.325, 0.125), (0.375, 0.325, 0.300), (0.050, 0.425, 0.525), (0.050, 0.525, 0.425), (0.375, 0.425, 0.200) in a coordinate including three coordinate axes of a, b, and c;

(2) a lead titanate zirconate containing as a main component the $PbMg_{1/3}Nb_{2/3}O_3$—$PbTiO_3$ternary solid solution system composition and containing 0.05 to 3% by mass of NiO; and (3) a $Pb(Mg, Ni)_{1/3}Nb_{2/3}O_3$—$PbZrO_3$—$PbTiO_3$ ternary solid solution system composition represented by the formula $Pb_x\{(Mg_{1-y}Ni_y)_{(1/3)}x_aNb_{2/3}\}_bTi_cZr_dO_3$, wherein $0.95 \leq x \leq 1.05$, $0.05 \leq y \leq 0.20$, $0.90 \leq a \leq 1.10$, and b, c, and d are decimals (additionally, b+c+d=1.00) in a range surrounded with (b, c, d)=(0.550, 0.425, 0.025), (0.550, 0.325, 0.125), (0.375, 0.325, 0.300), (0.050, 0.425, 0.525), (0.050, 0.525, 0.425), (0.375, 0.425, 0.200) in a coordinate including coordinate axes of b, c, and d, wherein the crystal grains are arranged in a film or layer having a thickness direction and a width direction perpendicular to the thickness direction, wherein each of the crystal grains, as observed in an arbitrary section in the thickness direction of the film or layer, has a width measured along the width direction of the film or layer, and has a thickness measured along the thickness direction of the film or layer, wherein the width of each crystal grain is greater than the thickness thereof in a portion of the large number of crystal grains, and wherein a number ratio of the portion to the large number of crystal grains is 70% or more as observed in the arbitrary section in the thickness direction of the film or layer; and a plurality of film-like or layer-like electrodes, wherein the plurality of piezoelectric/electrostrictive bodies are alternately sandwiched between and laminated on the plurality of electrodes.

6. A piezoelectric/electrostrictive laminate according to claim 5, wherein an average value of ratios (W/T) of the width (W) of the crystal grains in the width direction to the thickness (T) of the crystal grains in the thickness direction is 1.3 or more as observed in the arbitrary section in the thickness direction.

7. A piezoelectric/electrostrictive laminate according to claim 5, wherein an average value of the numbers of the crystal grains in the thickness direction, as observed in the arbitrary section in the thickness direction, is 2 or less.

8. A piezoelectric/electrostrictive film type actuator comprising, a substrate made of a ceramic; and a piezoelectric/electrostrictive driving portion disposed on the substrate and having at least one piezoelectric/electrostrictive portion and at least one pair of electrodes, the substrate being displaced by driving of the piezoelectric/electrostrictive driving portion, wherein the piezoelectric/electrostrictive portion is constituted of a piezoelectric/electrostrictive body comprising:

a large number of crystal grains having piezoelectric/electrostrictive properties and being one of:

(1) a $PbMg_{1/3}Nb_{2/3}O_3$—$PbZrO_3$—$PbTiO_3$ ternary solid solution system composition represented by the formula $Pb_x(Mg_{y/3}Nb_{2/3})_aTi_bZr_cO_3$, wherein $0.95 \leq x \leq 1.05$, $0.8 \leq y \leq 1.0$, and a, b, and c are decimals (additionally, a+b+c=1.00) in a range surrounded with (a, b, c)=(0.550, 0.425, 0.025), (0.550, 0.325, 0.125), (0.375, 0.325, 0.300), (0.050, 0.425, 0.525), (0.050, 0.525, 0.425), (0.375, 0.425, 0.200) in a coordinate including, three coordinate axes of a, b, and c;

(2) a lead titanate zirconate containing as a main component the $PbMg_{1/3}Nb_{2/3}O_3$—$PbTiO_3$ ternary solid solution system composition in (1) and containing 0.05 to 3% by mass of NiO; and (3) a $Pb(Mg, Ni)_{1/3}Nb_{2/3}O_3$—$PbZrO_3$—$PbTiO_3$ ternary solid solution system composition, represented by the formula $Pb_x\{(Mg_{1-y}Ni_y)_{(1/3)}x_aNb_{2/3}\}_bTi_cZr_dO_3$, wherein $0.95 \leq x \leq 1.05$, $0.05 \leq y \leq 0.20$, $0.90 \leq a \leq 1.10$, and b, c, and d are decimals (additionally, b+c+d=1.00) in a range surrounded with (b, c, d)=(0.550, 0.425, 0.025), (0.550, 0.325, 0.125), (0.375, 0.325, 0.300), (0.050, 0.425, 0.525), (0.050, 0.525, 0.425), (0.375, 0.425, 0.200) in a coordinate including three coordinate axes of b, c, and d, wherein the crystal grains being arranged in a film or layer having a thickness direction and a width direction perpendicular to the thickness direction, wherein each of the crystal grains, as observed in an arbitrary section in the thickness direction of the film or layer, has a width measured along the width direction of the film or layer, and has a thickness measured along the thickness direction of the film or layer, wherein the width of each crystal grain is greater than the thickness thereof in a portion of the large number of crystal grains, and wherein a number ratio of the portion to the large number of crystal grains is 70% or more as observed in the arbitrary section in the thickness direction of the film layer.

9. A piezoelectric/electrostrictive film type actuator according to claim 8, wherein an average value of ratios (W/T) of the width (W) of the crystal grains in the width direction to the thickness (T) of the crystal grains in the thickness direction is 1.3 or more as observed in the arbitrary section in the thickness direction.

10. A piezoelectric/electrostrictive film type actuator according to claim 8, wherein an average value of the numbers of the crystal grains in the thickness direction, as observed in the arbitrary section in the thickness direction, is 2 or less.

* * * * *

UNITED STATES PATENT AND TRADEMARK OFFICE
CERTIFICATE OF CORRECTION

PATENT NO. : 7,414,352 B2　　　　　　　　　　　　　　　　　　　　　　　Page 1 of 1
APPLICATION NO. : 11/305660
DATED : August 19, 2008
INVENTOR(S) : Tsutomu Nanataki, Mutsumi Kitagawa and Toshikatsu Kashiwaya It is certified that error appears in the above-identified patent and that said Letters Patent is hereby corrected as shown below:

Column 16

*Line 4*: change "$PbMg_{1/3}Nb_{2/3}O_3$—$PbTiO_3$" to --$PbMg_{1/3}Nb_{2/3}O_3$-$PbZrO_3$-$PbTiO_3$--

*Line 15*: add --three-- after "including"

*Line 62*: change "$PbMg_{1/3}Nb_{2/3}O_3$—$PbTiO_3$ternary" to

--$PbMg_{1/3}Nb_{2/3}O_3$-$PbZrO_3$-$PbTiO_3$ ternary--

Column 17

*Line 7*: add --three-- after "including"

Column 18

*Line 7*: delete "," after "including"

*Line 10*: change "$PbMg_{1/3}Nb_{2/3}O_3$—$PbTiO_3$" to

--$PbMg_{1/3}Nb_{2/3}O_3$-$PbZrO_3$-$PbTiO_3$--

*Line 14*: delete "," after "composition"

Signed and Sealed this

Eleventh Day of November, 2008

JON W. DUDAS
*Director of the United States Patent and Trademark Office*